(12) United States Patent
Peng et al.

(10) Patent No.: US 11,502,651 B2
(45) Date of Patent: Nov. 15, 2022

(54) OVERVOLTAGE PROTECTION AND GAIN BOOTSTRAP CIRCUIT OF POWER AMPLIFIER

(71) Applicant: SMARTER MICROELECTRONICS (GUANG ZHOU) CO., LTD., Guangzhou (CN)

(72) Inventors: Zhenfei Peng, Guangzhou (CN); Qiang Su, Guangzhou (CN); Kun Xiang, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 44 days.

(21) Appl. No.: 17/138,686

(22) Filed: Dec. 30, 2020

(65) Prior Publication Data
US 2021/0297047 A1    Sep. 23, 2021

Related U.S. Application Data

(63) Continuation of application No. PCT/CN2020/114829, filed on Sep. 11, 2020.

(30) Foreign Application Priority Data

Mar. 18, 2020    (CN) .......................... 202010192892.5

(51) Int. Cl.
| | |
|---|---|
| *H03F 1/52* | (2006.01) |
| *H03F 3/24* | (2006.01) |
| *H03F 3/195* | (2006.01) |
| *H03F 1/10* | (2006.01) |
| *H03G 3/30* | (2006.01) |

(52) U.S. Cl.
CPC ............... *H03F 1/523* (2013.01); *H03F 1/10* (2013.01); *H03F 3/195* (2013.01); *H03F 3/245* (2013.01); *H03G 3/3042* (2013.01); *H03F 2200/31* (2013.01); *H03F 2200/451* (2013.01)

(58) Field of Classification Search
CPC ....................................................... H03F 1/523
See application file for complete search history.

(56) References Cited

U.S. PATENT DOCUMENTS

| | | | | |
|---|---|---|---|---|
| 4,126,830 A | * | 11/1978 | Schade, Jr. ............. | H03F 1/523 330/253 |
| 5,270,660 A | * | 12/1993 | Werner, Jr ............. | G01R 29/12 324/458 |

(Continued)

*Primary Examiner* — Patricia T Nguyen
(74) *Attorney, Agent, or Firm* — Syncoda LLC; Feng Ma

(57) ABSTRACT

An overvoltage protection and gain bootstrap circuit of a power amplifier includes a power amplification transistor, and a diode reversely connected with a gate of the power amplification transistor. A negative electrode of the diode is connected with the gate of the power transistor, and a positive electrode of the diode is connected with a constant voltage source, such that a function of overvoltage protection and gain bootstrap of the circuit is realized by controlling a turn-on state of the diode. By adding a diode device to the circuit, gate-drain overvoltage protection for the power amplification transistor can be provided, and the gain of the amplifier can be improved before power compression, thereby improving linearity of the power amplifier. The structure of the circuit can be simple, with reduced occupied area hardware cost.

18 Claims, 5 Drawing Sheets

(56) References Cited

U.S. PATENT DOCUMENTS

| | | | |
|---|---|---|---|
| 10,193,554 B1* | 1/2019 | Sharma | H01L 27/0248 |
| 10,686,436 B2* | 6/2020 | Li | H02M 1/08 |
| 2016/0079979 A1* | 3/2016 | Kinzer | H02M 3/157 |
| | | | 327/333 |
| 2020/0169168 A1* | 5/2020 | Balaz | H03K 19/01735 |

* cited by examiner

OVERVOLTAGE PROTECTION AND GAIN BOOTSTRAP CIRCUIT OF POWER AMPLIFIER

CROSS-REFERENCE TO RELATED APPLICATIONS

This application is a continuation of International Application No. PCT/CN2020/114829 filed on Sep. 11, 2020, which claims priority to Chinese Patent Application No. 202010192892.5 filed on Mar. 18, 2020. The disclosures of these applications are hereby incorporated by reference in their entirety.

BACKGROUND

A power amplifier of the Radio Frequency Front-End module (RF FEM) system often uses Field Effect Transistors (FETs) based on Complementary Metal Oxide Semiconductor (CMOS) or Silicon-on-Insulator (SOI) process.

SUMMARY

Various embodiments of the present disclosure provide an overvoltage protection and gain bootstrap circuit of a power amplifier, a power amplifier and an electronic equipment; and by adding a diode device to the circuit, it can not only provide gate-drain overvoltage protection for a power amplification transistor, but also improve the gain effect of the amplifier before 1 dB power compression point of the radio frequency output.

According to a first aspect, some embodiments of the present disclosure provides an overvoltage protection and gain bootstrap circuit, the circuit includes a power amplification transistor and a diode, and the diode is reversely connected with a gate of the power amplification transistor;

herein, a negative electrode of the diode is connected with the gate of the power transistor, and a positive electrode of the diode is connected with a constant voltage source, so that a function of overvoltage protection and gain bootstrap of the circuit is realized by controlling a turn-on state of the diode.

In the above solution, the power amplification transistor adopts a common-source structure.

In the above solution, when a voltage difference between an output voltage of the constant voltage source and a gate voltage of the power amplification transistor is greater than a turn-on voltage of the diode, the diode is determined to be in a forward turn-on state.

In the above solution, when the diode is in the forward turn-on state, the gate voltage of the power amplification transistor is controlled to clamp to the output voltage of the constant voltage source, so as to realize a function of overvoltage protection of the circuit.

In the above solution, the gate of the power amplification transistor is further connected with a bias circuit, and the bias circuit is configured to provide a bias voltage for the power amplification transistor.

In the above solution, when the diode is in a forward turn-on state, a DC voltage component of a gate voltage of the power amplification transistor is higher than the bias voltage provided by the bias circuit, so as to realize a function of gain bootstrap of the circuit.

In the above solution, when the diode is in a forward turn-on state, the gain, at a 1 dB power compression point, of the circuit increases.

In the above solution, the gate of the power amplification transistor is connected with an input end of a radio frequency signal, a drain of the power amplification transistor is connected with an output end of the radio frequency signal, and a source of the power amplification transistor is grounded, so as to realize power amplification of the radio frequency signal.

In the above solution, the circuit further includes a first capacitor and a second capacitor;

herein, the first capacitor is provided between the gate of the power amplification transistor and the input end of the radio frequency signal, and the second capacitor is provided between the drain of the power amplification transistor and the output end of the radio frequency signal.

In the above solution, the circuit further includes a radio frequency choke, and the radio frequency choke is connected with the drain of the power amplification transistor.

In the above solution, the power amplifier includes a metal oxide semiconductor field effect transistor.

According to a second aspect, some embodiments of the present disclosure also provides a power amplifier, and the power amplifier includes at least the overvoltage protection and gain bootstrap circuit described in any one of the above embodiments.

According to a third aspect, some embodiments of the present disclosure also provides an electronic equipment, and the electronic equipment includes at least the power amplifier described above.

Some embodiments of the disclosure provide an overvoltage protection and gain bootstrap circuit of a power amplifier, a power amplifier and an electronic equipment, and the circuit includes a power amplification transistor and a diode, and the diode is reversely connected with a gate of the power amplification transistor; herein, a negative electrode of the diode is connected with the gate of the power transistor, and a positive electrode of the diode is connected with a constant voltage source, such that a function of overvoltage protection and gain bootstrap of the circuit is realized by controlling a turn-on state of the diode. In this way, by adding only a diode device to the circuit, it can not only provide gate-drain overvoltage protection for the power amplification transistor, but also improve the gain of the power amplifier before power compression, thereby improving the linearity of the power amplifier; in addition, the structure of the circuit of the disclosure is simple, the occupied area thereof is small, and the hardware cost thereof is reduced.

It should be understood that the above general descriptions and the following detailed descriptions are merely illustrative and interpretive, and are not intended to limit the embodiments of the disclosure.

Other features and aspects of the disclosure will become clear in light of the detailed description of the exemplary embodiments described below with reference to the appended figures.

BRIEF DESCRIPTION OF THE DRAWINGS

The drawings, which are incorporated into the disclosure and form a part of the disclosure, illustrate the embodiments conforming to the disclosure and explain some technical solutions of the disclosure together with the specification.

DETAILED DESCRIPTION

An FET may be required not to suffer from overvoltage (OV) when outputting large radio frequency power, otherwise it will result in the damage of the FET. In the design of power amplifier, due to the reversal of the voltage between the gate and the drain, there is usually an overvoltage phenomenon of a gate-drain voltage, which results in the breakdown or even damage of the oxide layer of the gate of the FET when the gate-drain voltage is under overvoltage. In addition, due to the low carrier mobility of FET devices of CMOS-type, the gain thereof will suffer from a poor gain effect before 1 dB power compression point (Pie) of the radio frequency output, which limits the application of the FET devices of CMOS-type in linear power amplifiers.

In the radio frequency front-end system, the Field-Effect Transistor (FET) is usually configured as the main device to amplify the power, such as the field effect transistor of CMOS-type or based on the Silicon-on-Insulator (SOI) process. Herein, the FET is required to output large radio frequency power without suffering from overvoltage. By improving the design of the circuit of single FET transistor, larger radio frequency output power may be obtained with the gate and the drain being not suffered from overvoltage. In addition, in the design of Power Amplifier (PA), it is often required that a part of the gain thereof before 1 dB power compression point of the radio frequency output has a strong gain boost effect, so as to achieve better linearity of PA.

Figure 1:
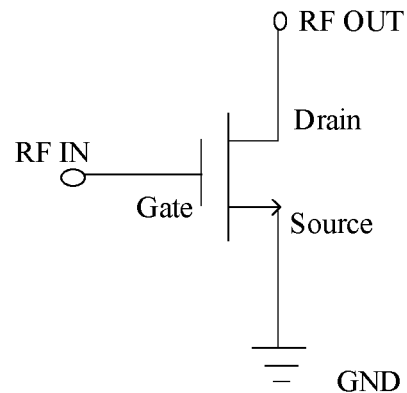
FIG. 1 is a schematic diagram of the structure of the circuit of a field effect transistor provided by the related technical solution.

In the single-ended amplification circuit structure of a power amplifier using a field effect transistor, it is generally required that the field effect transistor adopts a common-source structure, such as FIG. 1, which illustrates a schematic diagram of the structure of the circuit of a field effect transistor adopting a common-source structure provided in the related technical solution, and as illustrated in FIG. 1, the gate of the FET is connected with a radio frequency signal input (RF IN), the source thereof is grounded (GND), and the drain thereof is connected with a radio frequency signal output (RF OUT), and such amplification circuit is characterized by providing high signal gain and having a relatively smooth gain dynamic range.

Figure 2:
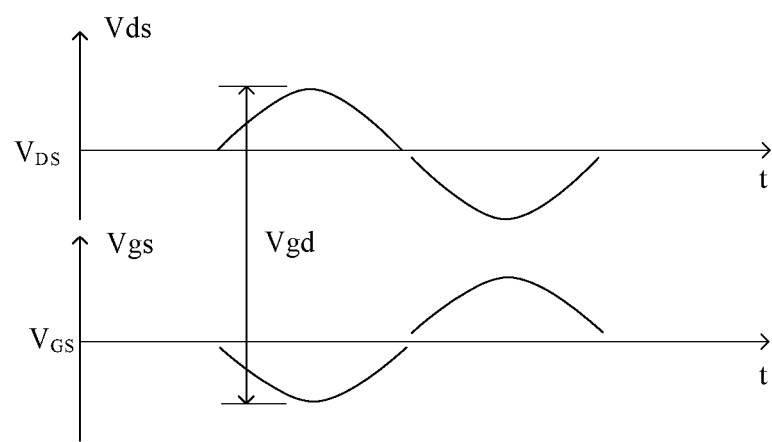
FIG. 2 is a schematic diagram of the time domain waveform of the gate and drain voltages of a field effect transistor provided by the related technical solution.

Due to the device characteristics of the FET of CMOS-type, when the common-source amplification structure is adopted, the voltage between the gate and the drain of the FET is reversed, refer to FIG. 2, which illustrated a diagram of the time domain waveform of the gate and drain voltages of a field effect transistor provided by related technical solution, herein the X axis (i.e. horizontal axis) represents time t, the upper Y axis (i.e. vertical axis) represents voltage $V_{DS}$ between the drain and the source, and the lower Y axis (i.e. vertical axis) represents voltage $V_{GS}$ between the gate and the source; and for FET, the difference between the gate-source voltage ($V_{gs}$) and the drain-source voltage ($V_{ds}$) is the gate-drain voltage ($V_{gd}$), and as illustrated in FIG. 2, due to the reversal of the voltage between the gate and the drain, the gate-drain voltage ($V_{gd}$) in some interval of the period of the time domain waveform will suffer from overvoltage, resulting in breakdown or even damage of the oxide layer of the gate of the FET at the gate-drain voltage.

Figure 3:
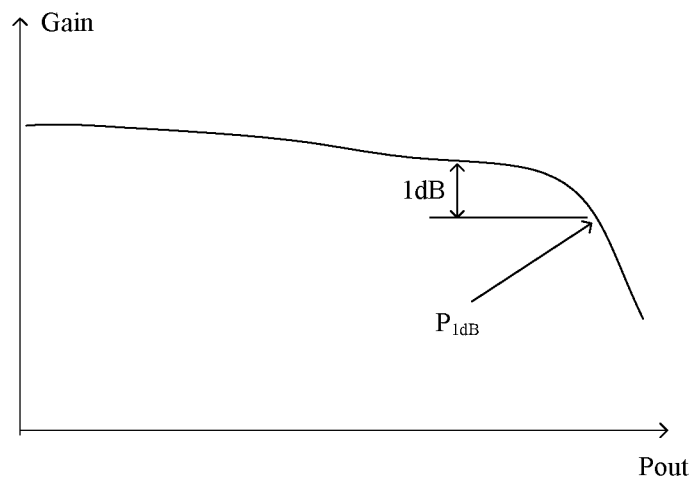
FIG. 3 is a schematic diagram of the AMAM distortion curve of a field effect transistor provided by the related technical solution.

In addition, amplitude-amplitude (AM-AM) distortion occurs in radio frequency devices using the FET as power amplifier due to nonlinearity between the input voltage and output current of the FET, and the AM-AM distortion refers to the distortion of the amplitudes of the output signal and input signal, for example, when the input signal swings below a threshold voltage or above a saturation voltage, the output voltage signal will be truncated or chopped, which is referred to as AM-AM distortion. Refer to FIG. 3, which illustrated a schematic diagram of the AMAM distortion curve of a field effect transistor provided by the related technical solution, that is, the curve of the power gain (Gain) changing with the output power Pout of a signal, herein the power gain (Gain) is usually in decibel (dB), and its calculation method is illustrated in formula (1).

$$\text{Gain} = P_{out} - P_{in} \qquad (1)$$

$P_{out}$ and $P_{in}$ are in decibel relative to one milliwatt (dBm), and the Gain is in decibel (dB); and $P_{out}$ is the output power of PA and $P_{in}$ the input power of PA.

When the power is amplified by the field effect transistor, there is a linear dynamic range for its amplification performance. Within this range, the output power of the power amplifier increases linearly with the input power; and when the output power increases to a certain extent, with the continuous increase of the input power, the amplification performance of the power amplifier enters a nonlinear region, and its output power no longer increases linearly with the increase of the input power. That is, when the power amplifier is in the nonlinear region, its output power is lower than the value predicted by the signal gain, and generally, the value of the output power when the gain drops to 1 dB below the linear gain is defined as the 1 dB compression point of the output power ($P_{1dB}$). As illustrated in FIG. 3, the X axis (i.e., horizontal axis) represents the output power Pout of the signal, and the Y axis (i.e., vertical axis) represents the power gain (Gain), and it may be seen from FIG. 3 that the gain-output power (AMAM) distortion curve of the FET device of CMOS-type cannot form obvious gain expansion before a large signal $P_{1dB}$ due to the low carrier mobility of the FET device of CMOS-type, and these disadvantages will limit the application of the FET of CMOS-type in linear power amplifiers.

There are many types of power amplifiers, such as type A, type B, type AB and type D and the differences among them are as follows:

Type A: two groups of power amplification transistors in the output stage of the power amplifier of type A are always in turn-on state, that is, they remain to conduct the current no matter there is a signal input or not, and make the conduction current equal to the peak value of alternating current, then the alternating current flows into the load with the maximum signal; and when there is no signal, the equal amount of current flows into each of two power amplification transistors, so there is no unbalanced current or voltage at the output center point. The operating mode of the power amplifier of type A has the best linearity, and each output power amplification transistor amplifies the full wave of the signal without crossover distortion, however, because the full current still flows into the power amplifier of type A when there is no signal, and all the electric energy turn into heat, and even when the signal level increases, some power may enter the load, but a lot of power still turn into heat, so the efficiency of the power amplifier of type A is relatively low;

Type B: the operating mode of the power amplifier of type B is that when there is no signal input, the output power amplification transistor is non-conductive, so it does not consume power, and when there is a signal, each pair of output transistor amplifies half of the waveform, and turns on and off in turn to complete amplification of the full wave; and the efficiency of the power amplifier of type B is higher than that of type A, but the crossover distortion will occur when two output power amplifiers operate alternately, so the effect of the power amplifier of type B is not as good as that of type A;

Type AB: the power amplifier of type AB is generally biased between type A and type B, and it remedies the shortcomings of the amplifiers of type A and type B;

Type D: the power amplifier of type D directly connects the load with the power supply as soon as the power amplification transistor is turned on, and the current flows through; but the power amplification transistor has no voltage, and so there is no power consumption thereon, and when the output power amplification transistor is turned off, the entire voltage of the power supply is applied to the power amplification transistor without any current, so there is also no power consumption thereon, so that there is no efficiency loss in theory, however, the power amplifier of type D operates with complexity and high failure rate.

Based on this, the embodiments of the present disclosure provide an overvoltage protection and gain bootstrap circuit of a power amplifier, the circuit includes a power amplification transistor and a diode, and the diode is reversely connected with a gate of the power amplification transistor; herein, a negative electrode of the diode is connected with the gate of the power transistor, and a positive electrode of the diode is connected with a constant voltage source, so that a function of overvoltage protection and gain bootstrap of the circuit is realized by controlling a turn-on state of the diode; in this way, by adding only a diode device to the circuit, it can not only provide gate-drain overvoltage protection for the power amplification transistor, but also improve the gain of the power amplifier before power compression, thereby improving the linearity of the power amplifier; in addition, the structure of the circuit of the disclosure is simple, the occupied area thereof is small, and the hardware cost thereof is reduced.

Figure 4:
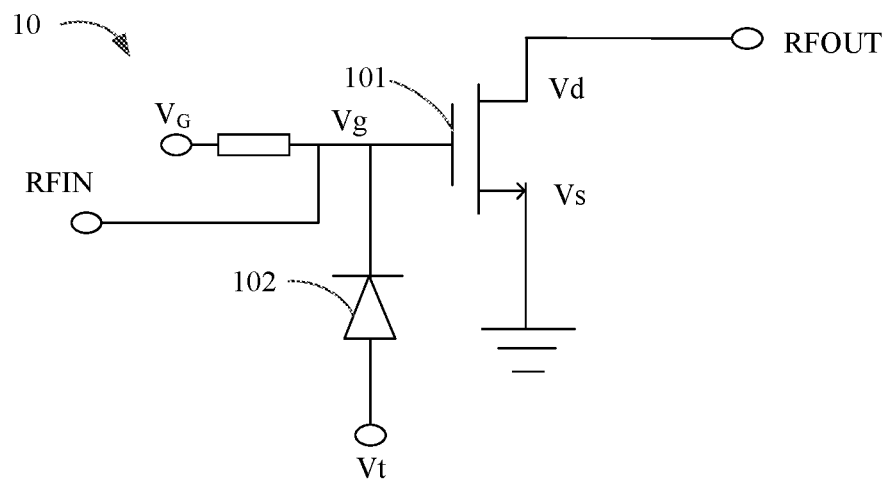
FIG. 4 is a schematic diagram of the structure of an overvoltage protection and gain bootstrap circuit of a power amplifier provided by an embodiment of the disclosure.

An overvoltage protection and gain bootstrap circuit of a power amplifier provided by an embodiment of the disclosure may refer to FIG. 4, which illustrated a schematic diagram of the structure of an overvoltage protection and gain bootstrap circuit 10 of a power amplifier provided by an embodiment of the present disclosure. As illustrated in FIG. 4, the circuit 10 includes a power amplification transistor 101 and a diode 102, and the diode 102 is reversely connected with a gate of the power amplifier 101.

A negative electrode of the diode 102 is connected with the gate of the power amplification transistor 101, and a positive electrode of the diode 102 is connected with a constant voltage source, so that a function of overvoltage protection and gain bootstrap of the circuit 10 is realized by controlling a turn-on state of the diode 102.

It should be noted that the power amplification transistor 101 is a device that plays a major amplifying role in a power amplifier, and may have various forms, such as an N-Metal-Oxide-Semiconductor (NMOS) transistor, a Laterally-Diffused Metal-Oxide Semiconductor (LDMOS) transistor, a High Electron Mobility Transistor (pHEMP) or a Heterojunction Phototransistor (HPT) transistor, etc.; and the diode may be a germanium diode, a silicon diode or a diode realized by a heterojunction process such as gallium arsenide process (GaAs process) etc., and is not limited thereto in the embodiment.

It should also be noted that the crystal diode is an electronic device made of semiconductor material with the characteristics of unidirectional conduction, that is, when a direct voltage is applied to the positive and negative electrodes of the crystal diode, the crystal diode is turned on, and since the turn-on voltage drop of the crystal diode is generally small (the turn-on voltage drop is 0.3V for the germanium diode and 0.7V for silicon diode), the turned-on crystal diode is equivalent to a resistor with small resistance; and when the reverse voltage is applied to the positive and negative electrodes of the crystal diode, the crystal diode is turned off, which is equivalent to open circuit; and clamping of the diode takes advantage of such principle. In the embodiment of the disclosure, the function of overvoltage protection and gain bootstrap of the circuit 10 is realized by the clamping effect of the diode 102 on the gate voltage of the power amplification transistor 101.

In this embodiment, the power amplification transistor 101 includes a power amplification transistor of metal oxide semiconductor field effect.

It should be noted that for the power amplification transistor 101, devices such as a triode, or LDMOS, FET of HPT-type may be used, and the principle thereof is similar.

In this embodiment, the power amplification transistor 101 adopts a common-source or common-emitter structure.

It should be noted that when the power amplifier using CMOS transistor as an amplification element may take three basic forms: common-source, common-gate and common-drain, and the common-source amplification circuit has the characteristics of high voltage gain, reverse amplification and large input impedance, and has the most extensive application scenarios; and the common-drain amplification circuit has the characteristics of a voltage amplification factor of about 1, co-directional amplification, large input impedance and low output impedance, which is generally used for impedance transformation; and the common-gate amplification circuit has the characteristics of high voltage gain, co-directional amplification and small input impedance. In the embodiments of the disclosure, the common-source amplification structure is preferably adopted, and its equivalent circuit is equivalent to the source being grounded, which may play the role of reverse amplification and have high voltage gain.

In this embodiment, when a voltage difference between an output voltage of the constant voltage source and a gate voltage of the power amplification transistor 101 is greater than a turn-on voltage of the diode 102, the diode 102 is determined to be in a forward turn-on state.

It should be noted that as illustrated in FIG. 4, the diode 102 is reversely connected with the gate-source of the power amplification transistor 101, that is, the positive electrode of the diode 102 is connected with a constant voltage source and the negative electrode thereof is connected with the gate of the power amplification transistor 101, and when the gate voltage of the power amplification transistor 101 is too low, the difference between the gate voltage and the output voltage of the constant voltage source will be greater than the turn-on voltage of the diode 102, so that the diode 102 is in the forward turn-on state, then there is a voltage difference between two ends of the diode 102 which is approximately equal to the "ON voltage", after the diode 102 being turned on.

In this embodiment, when the diode 102 is in the forward turn-on state, the gate voltage of the power amplification transistor 101 is controlled to clamp to the output voltage of the constant voltage source, so as to realize a function of overvoltage protection of the circuit 10.

It should be noted that as illustrated in FIG. 4, it is assumed that the dynamic voltage $V_G$ is the non-signal input voltage provided to the gate of the power amplification transistor 101 (which is equivalent to the bias voltage provided by the bias circuit in practical applications), and $V_g$ is the actual gate voltage of the power amplification transistor 101, and generally speaking, in order to distinguish the bias voltage $V_G$ from the actual gate voltage $V_g$, in the embodiment of the disclosure, a resistor is usually set between the $V_G$ and $V_g$ as an isolation, and $V_d$ is the drain voltage of the power amplification transistor 101, and the output voltage of the constant voltage source is $V_t$; since the source of the transistor is grounded, that is, the source voltage thereof is 0, so $V_{gs}=V_g$, $V_{ds}=V_d$, and at this time, according to the different turn-on states of the diode 102, two cases are present.

Case 1: when $V_t-V_G<V_0$, herein $V_0$ is the turn-on voltage of the diode 102, then the diode 102 is in a non-turn-on state, and the actual gate voltage $V_g$ of the power amplification transistor 101 is the non-signal input voltage $V_G$, i.e. $V_g=V_G$;

Case 2: when $V_t-V_G \geq V_0$, then the diode 102 is in a turn-on state, and the gate voltage $V_g$ of the power amplification transistor 101 is clamped to $V_t-V_j$, herein, $V_j$ is the turn-on voltage drop of the diode 102, which is generally small, and it may be approximately considered that $V_g=V_t$, that is, $V_g$ is clamped from $V_G$ to $V_t$ by the diode.

That is, due to the presence of the diode 102, the actual gate voltage $V_g$ of the power amplification transistor 101 will not be less than the difference between the voltage $V_t$ provided by the constant voltage source and the turn-on voltage $V_j$ of the diode.

Figure 5:
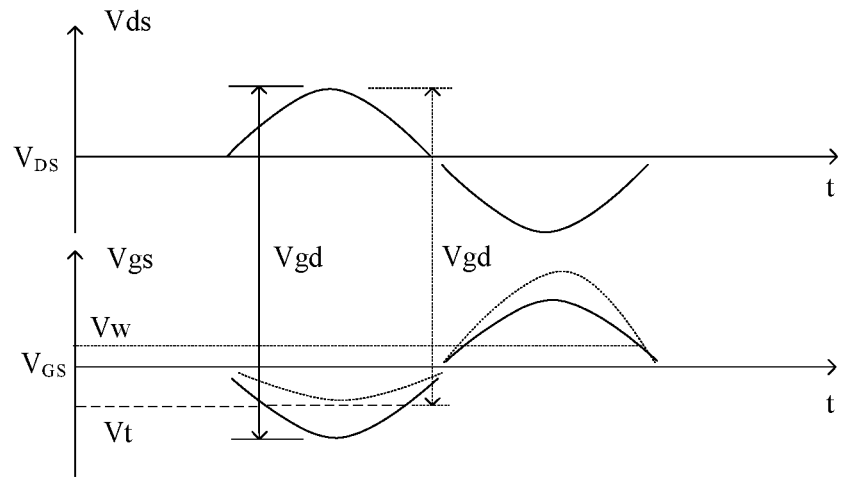
FIG. 5 is a schematic diagram of the time domain waveform of an overvoltage protection and gain bootstrap circuit of a power amplifier provided by an embodiment of the disclosure.

Therefore, the diode 102 reversely connected with the gate-source may prevent the gate voltage $V_g$ of the power amplification transistor 101 from being too low, thus preventing the voltage between the gate and the drain thereof from being too high and thus breaking down the power amplification transistor 101. Refer to FIG. 5, which illustrates a diagram of the time domain waveform of an overvoltage protection and gain bootstrap circuit of a power amplifier provided by an embodiment of the disclosure; Herein, the X axis (i.e. horizontal axis) represents time t, the upper Y axis (i.e. vertical axis) represents voltage $V_{DS}$ between the drain and the source, and the lower Y axis (i.e. vertical axis) represents voltage $V_{GS}$ between the gate and the source; the curve of solid line is a diagram of the time domain waveform of the gate-drain voltage of a power amplifier without a diode, and the curve of dash line is diagram of the time domain waveform of the gate-drain voltage of a power amplifier with a diode, and as illustrated in FIG. 5, due to the presence of diode 102, the lower edge of the voltage amplitude of $V_{GS}$ will be no less than $V_t-V_j$, that is, the maximum value of the gate-drain voltage $V_{gd}$ of the power amplification transistor 101 is reduced from $V_d-V_G$ to $V_d-(V_t-V_j)$, and $V_j$ represents the forward turn-on voltage of the diode 102, thus preventing the overvoltage of the gate-drain and playing the role of overvoltage protection.

It should also be noted that the function of the constant voltage source connected with the diode is to provide a constant voltage, so grounding the positive electrode of the diode is also a implementation of connecting the diode with the constant voltage source, at this time, $V_t=0$. For the crystal diode, the forward turn-on voltage (which may be represented by $V_j$) remains basically unchanged after its forward turn-on, for example, the forward turn-on voltage is 0.7V for the silicon diode and 0.3V for the germanium transistor. Since the forward turn-on voltage of the diode 102 in the turn-on state is negligible with respect to $V_t$, it may be considered that $V_t-V_j \approx V_t$.

In some embodiments, the gate of the power amplification transistor 101 is further connected with a bias circuit, and the bias circuit is configured to provide a bias voltage for the power amplification transistor 101.

It should be noted that in order to ensure that the amplifier consisting of FET devices performs non-distortion amplification on the signal voltage, it is necessary to ensure that the gate voltage of the FET device is at the required potential, i.e., that the $V_g$ of the first power transistor 101 is within a certain range, and the bias circuit is configured to implement this process, i.e., to provide the bias voltage $V_G$ for the power amplification transistor 101.

In some embodiments, when the diode 102 is in a forward turn-on state, a DC voltage component of a gate voltage of the power amplification transistor 101 is higher than the bias voltage provided by the bias circuit, so as to realize a function of gain bootstrap of the circuit 10.

It should be noted that according to the bias voltage provided by the bias circuit, the voltage $V_t$ provided by the constant voltage source may be designed accordingly, so that when the diode 102 is turned on, the gate voltage component of the power amplification transistor 101 is higher than the bias voltage provided by the bias circuit, still as illustrated in FIG. 5, $V_W$ represents the DC component of the gate voltage of the power amplification transistor 101, and in the region where the diode 102 is forward turned on, $V_W$ is greater than the DC voltage component of the bias voltage $V_G$ provided by the original bias circuit, so that the amplification type of the power amplifier tends to be type A.

Figure 6:
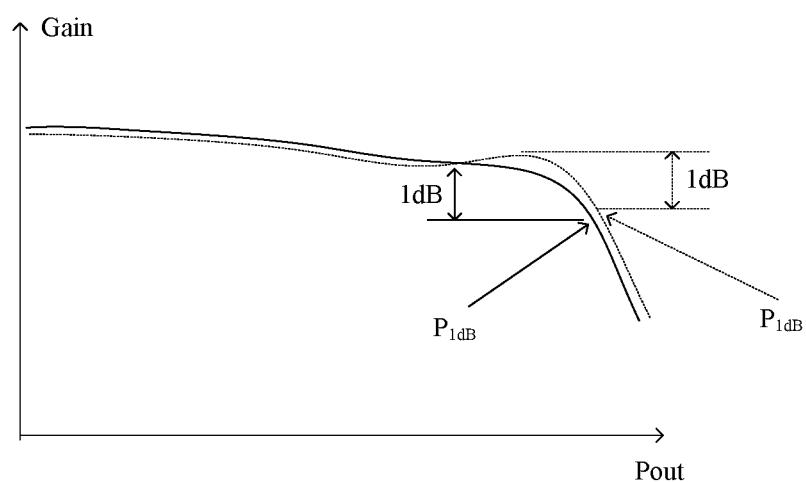
FIG. 6 is a schematic diagram of the AMAM distortion curve of an overvoltage protection and gain bootstrap circuit of a power amplifier provided by an embodiment of the disclosure.

Specifically, refer to FIG. 6, which illustrates a schematic diagram of the AMAM distortion curve of an overvoltage protection and gain bootstrap circuit of a power amplifier provided by an embodiment of the disclosure. Herein, the curve of solid line is the AMAM distortion curve of the power amplification transistor without a diode, and the curve of dash line is the AMAM distortion curve of the power amplification transistor with a diode, and as illustrated in FIG. 6, the AMAM distortion curve of power amplification transistor with a diode exhibits gain expansion when the output power reaches the $P_{1dB}$ point, which presents a bootstrap characteristic to realize the function of gain bootstrap of the circuit 10, thereby improving the power gain.

In this embodiment, when the diode 102 is in the forward turn-on state, the gain, at a 1 dB power compression point, of the overvoltage protection and gain bootstrap circuit 10 of the power amplifier increases.

It should be noted that when the diode 102 is turned on, the transient voltage of the gate generally swings up and down with the bias voltage $V_g$ as the center, and the turn-on of the diode enables the transient voltage of the gate not to be lower than $V_t-V_j$, then the time domain waveform of the power amplification transistor 101 is equivalent to performing a waveform shaping, as illustrated in FIG. 6, since the DC component of the shaped waveform of gate voltage $V_w$ is higher than the original DC component of the gate voltage $V_G$, the AMAM curve of the power amplification transistor represents the linearity of gain bootstrap, so that the value of $P_{1dB}$ of the power amplification transistor with a diode is higher than the value of $P_{1dB}$ of the AMAM distortion curve of the power amplification transistor without a diode, thereby improving the linearity of the power amplifier and increasing the power gain.

In this way, an overvoltage protection and gain boost between the gate and the drain of the FET may be achieved simultaneously to some extent by design the diode reversely connected with the gate-source. The operating principle is to utilize the forward turn-on characteristics of the diode and its rectification effect. Specifically, the diode is reversely connected with the gate-source, and the dynamic voltage $V_g$ is set to be the gate voltage of the FET and $V_d$ is set to be the drain voltage of power amplification transistor. The constant voltage source $V_t$ is the voltage at the positive electrode of the diode, and $V_t$ may also be grounded to a voltage of zero. As illustrated in FIG. 5, the gate voltage $V_g$ of the turn-on power amplification transistor of the diode is clamped to $V_t$ when the voltage difference $V_t-V_g$ exceeds the turn-on voltage of the diode during the period of the time domain waveform. In this way, in the case of a large radio frequency input signal, the upper edge of the voltage amplitude of the drain output power will remain unchanged, but the lower edge of the voltage amplitude of the gate input power will not be lower than $V_t$, which may improve the overvoltage (OV) between the gate and the drain. In addition, as illustrated in FIG. 6, when the diode is turned on and the appropriate value is selected for $V_t$, then the gate voltage of the power amplification transistor is equivalent to performing a waveform shaping, and the DC component of the shaped waveform of the gate voltage $V_q$ will be higher than the original gate bias voltage $V_G$, which will indirectly make the amplification type of PA (such as type AB) tend to be type A, thereby achieving a gain boost. Since the source is grounded, $V_{gs}=V_g$ and $V_{ds}=V_d$. For qualitative purposes, the forward turn-on voltage of the diode is ignored temporarily.

In this embodiment, the gate of the power amplification transistor 101 is connected with an input end of a radio frequency signal, a drain of the power amplification transistor 101 is connected with an output end of the radio frequency signal, and a source of the power amplification transistor 101 is grounded, so as to realize power amplification of the radio frequency signal.

It should be noted that for the over-voltage protection and gain bootstrap circuit 10 of the constructed power amplifier, the gate of the power amplification transistor 101 is connected with the input end of the radio frequency signal, the drain of the power amplification transistor 101 is connected with the output end of radio frequency signal, and the source of the power amplification transistor 101 is grounded, so that the signal input to the gate is amplified and output from the drain.

Some embodiments of the present disclosure provide an overvoltage protection and gain bootstrap circuit of a power amplifier, the circuit includes a power amplification transistor and a diode, and the diode is reversely connected with a gate of the power amplification transistor; herein, a negative electrode of the diode is connected with the gate of the power transistor, and a positive electrode of the diode is connected with a constant voltage source, so that a function of overvoltage protection and gain bootstrap of the circuit is realized by controlling a turn-on state of the diode; in this way, by adding only a diode device to the circuit, it can not only provide gate-drain overvoltage protection for the power amplification transistor, but also improve the gain of the power amplifier before power compression, thereby improving the linearity of the power amplifier; in addition, the structure of the circuit of the disclosure is simple, the occupied area thereof is small, and the hardware cost thereof is reduced.

Figure 7:
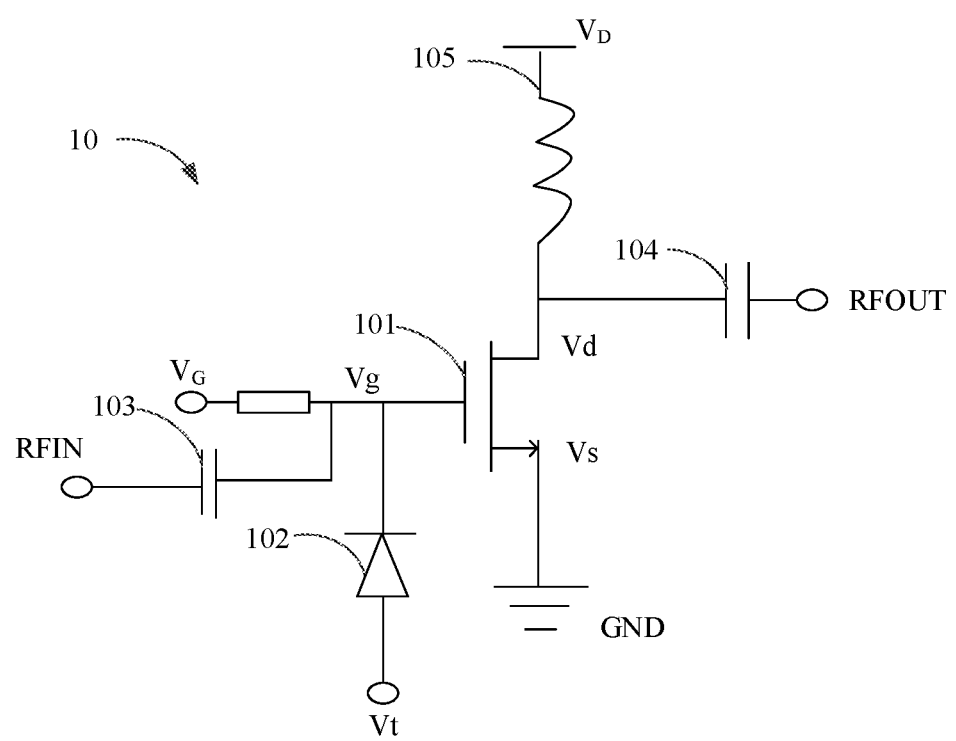
FIG. 7 is a schematic diagram of the structure of another overvoltage protection and gain bootstrap circuit of a power amplifier provided by an embodiment of the disclosure.

In another embodiment of the disclosure, on the basis of the over-voltage protection and gain bootstrap circuit 10 of the power amplifier illustrated in FIG. 4, refer to FIG. 7, which illustrated a schematic diagram of the structure of another overvoltage protection and gain bootstrap circuit of a power amplifier provided by an embodiment of the disclosure. As illustrated in FIG. 7, the over-voltage protection and gain bootstrap circuit 10 of the power amplifier further includes a first capacitor 103 and a second capacitor 104;

herein, the first capacitor 103 is provided between the gate of the power amplification transistor 101 and the input end of the radio frequency signal; and the second capacitor 104 is provided between the drain of the power amplification transistor 101 and the output end of the radio frequency signal.

It should be noted that the first capacitor 103 and the second capacitor 104 play the role of isolating the radio frequency input signal (RF IN) and the radio frequency output signal (RF OUT), respectively, so that the gate and the drain of the power amplification transistor 101 are at a proper DC bias potential.

In this embodiment, the overvoltage protection and gain bootstrap circuit 10 of the power amplifier further includes a radio frequency choke 105, and the radio frequency choke 105 is connected with the drain of the power amplification transistor 101.

It should be noted that the Radio Frequency Chokes (RF chokes) are configured to suppress inductors used for high frequency purposes, and that the radio frequency choke 105 exhibit high impedance to high frequency signals to prevent them from leaving the system, thereby ensuring normal output of the power amplifier.

In this way, by adding only a diode device to the circuit, it can not only provide gate-drain overvoltage protection for the power amplification transistor, but also improve the gain of the power amplifier before power compression, thereby improving the linearity of the power amplifier; in addition, the structure of the circuit of the disclosure is simple, the occupied area thereof is small, and the hardware cost thereof is reduced.

Figure 8:
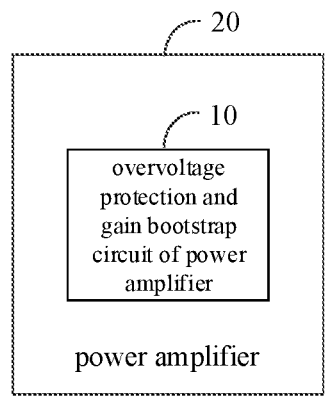
FIG. 8 is a schematic diagram of the structure of a power amplifier provided by an embodiment of the disclosure.

In another embodiment of the disclosure, refer to FIG. 8, which illustrate a schematic diagram of the structure of a power amplifier provided by an embodiment of the disclosure. As illustrated in FIG. 8, the power amplifier 20 includes at least the overvoltage protection and gain bootstrap circuit 10 of the power amplifier described in any one of the above embodiments.

In the embodiment of the present disclosure, the power amplifier 20 may be integrated with the overvoltage protection and gain bootstrap circuit 10 of the power amplifier, and the overvoltage protection and gain bootstrap circuit 10 of the power amplifier includes a power amplification transistor and a diode, and the diode is reversely connected with a gate of the power amplification transistor; herein, a negative electrode of the diode is connected with the gate of the power transistor, and a positive electrode of the diode is connected with a constant voltage source, such that a function of overvoltage protection and gain bootstrap of the circuit is realized by controlling a turn-on state of the diode; in this way, by adding only a diode device to the circuit, it can not only provide gate-drain overvoltage protection for the power amplification transistor, but also improve the gain of the power amplifier before power compression, thereby improving the linearity of the power amplifier; in addition, the structure of the circuit of the disclosure is simple, the occupied area thereof is small, and the hardware cost thereof is reduced.

Figure 9:
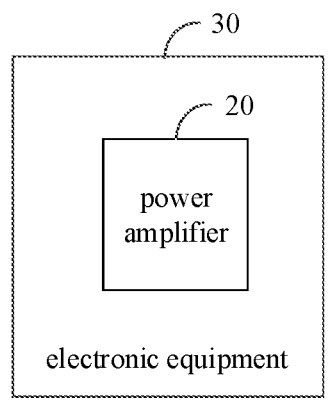
FIG. 9 is a schematic diagram of the structure of an electronic equipment provided by an embodiment of the disclosure.

In another embodiment of the present disclosure, refer to FIG. 9, which illustrates a schematic diagram of the structure of an electronic equipment 30 provided by an embodiment of the disclosure. As illustrated in FIG. 9, the equipment device 30 includes at least the power amplifier 20 described In this embodiment, and by adding a diode device to the circuit, it can provide gate-drain overvoltage protection for the power amplification transistor, and improve the gain of the amplifier before power compression, and improve the linearity of the power amplifier to a certain extent; moreover, only a diode device and a constant voltage source are added, so that the structure of the circuit is simple, the occupied area thereof on a chip is small, and the hardware cost thereof is low.

It should be noted that in the disclosure, the terms "including", "comprising" or any other variant thereof are intended to cover non-exclusive inclusion, so that a process, method, article or device including a series of elements includes not only those elements, but also other elements which are not explicitly listed, or further includes elements inherent to such process, method, article or device. Without further limitation, the element defined by the sentence "including one . . . " does not exclude the presence of other identical elements in such process, method, article or device in which the element is included.

The above-mentioned serial numbers of the embodiments of the disclosure are only for description, and do not represent what embodiments are advantageous or what embodiments are disadvantageous.

The methods disclosed in several embodiments of method of the disclosure may be combined arbitrarily without conflict to obtain new embodiments of method.

The features disclosed in several embodiments of product of the disclosure may be combined arbitrarily without conflict to obtain new embodiments of product.

The features disclosed in several embodiments of method or equipment of the disclosure may be combined arbitrarily without conflict to obtain new embodiments of method or equipment.

The above descriptions are only specific embodiments of the disclosure, but the protection scope of the disclosure is not limited to thereto, and any technicians familiar with this technical field may easily conceive of changes or substitutions within the technical scope disclosed in the disclosure, which should be covered within the protection scope of the disclosure. Therefore, the protection scope of the disclosure shall be subject to the protection scope of the claims.

In some embodiments of the disclosure, an overvoltage protection and gain bootstrap circuit of a power amplifier includes a power amplification transistor and a diode, and the diode is reversely connected with a gate of the power amplification transistor; herein, a negative electrode of the diode is connected with the gate of the power transistor, and a positive electrode of the diode is connected with a constant voltage source, so that a function of overvoltage protection and gain bootstrap of the circuit is realized by controlling a turn-on state of the diode; in this way, by adding only a diode device to the circuit, it can not only provide gate-drain overvoltage protection for the power amplification transistor, but also improve the gain of the power amplifier before power compression, thereby improving the linearity of the power amplifier; in addition, the structure of the circuit of the disclosure is simple, the occupied area thereof is small, and the hardware cost thereof is reduced.

Herein, the description of each of the circuits and specific gain control method may be found in the descriptions of the preceding embodiments and will not be described in detail here. It should be understood that references to 'an embodiment' or 'one embodiment' throughout the specification imply that a particular feature, structure or characteristic related to the embodiment is included in at least one embodiment of the disclosure. Therefore, the presence of 'in an embodiment' or 'in one embodiment' throughout the specification does not necessarily refer to the same embodiment. In addition, these particular features, structures or characteristics may be combined in one or more embodiments in any appropriate manner. It should be understood that in various embodiments of the disclosure, the serial numbers of the processes described above do not imply an sequence of execution, and the sequence of execution of the processes shall be determined by their functions and inherent logics and shall not limit the implementation of the embodiments of the disclosure in any way. The above-mentioned serial numbers of the embodiments of the disclosure are only for description, and do not represent what embodiments are advantageous or what embodiments are disadvantageous.

It should be noted that herein, the terms 'including', 'comprising' or any other variant thereof are intended to cover non-exclusive inclusion, so that a process, method, article or device including a series of elements includes not only those elements, but also other elements which are not explicitly listed, or further includes elements inherent to such process, method, article or device. Without further limitation, the element defined by the sentence "including one . . . " does not exclude the presence of other identical elements in such circuit in which the element is included.

The above descriptions are merely embodiments of the disclosure, but the protection scope of the disclosure is not limited thereto, and any technicians familiar with this technical field may readily conceive of variations or substitutions within the technical scope disclosed by the disclosure, and the variations or substitutions shall be covered by the protection scope of the disclosure. Therefore, the protection scope of the disclosure shall be subject to the protection scope of the claims.

The terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. An overvoltage protection and gain bootstrap circuit of a power amplifier, comprising:
   a power amplification transistor and a diode, and the diode is reversely connected with a gate of the power amplification transistor;
   wherein
   a negative electrode of the diode is connected with the gate of the power transistor;
   a positive electrode of the diode is connected with a constant voltage source, such that a function of overvoltage protection and gain bootstrap of the circuit is realized by controlling a turn-on state of the diode;
   the gate of the power amplification transistor is further connected with a bias circuit, and the bias circuit is configured to provide a bias voltage for the power amplification transistor; and
   when the diode is in a forward turn-on state, the gain, at a 1 dB power compression point, of the circuit increases.

2. The overvoltage protection and gain bootstrap circuit of claim 1, wherein the power amplification transistor adopts a common-source structure.

3. The overvoltage protection and gain bootstrap circuit of claim 1, wherein
   when a voltage difference between an output voltage of the constant voltage source and a gate voltage of the power amplification transistor is greater than a turn-on voltage of the diode, the diode is determined to be in a forward turn-on state.

4. The overvoltage protection and gain bootstrap circuit of claim 3, wherein
   when the diode is in the forward turn-on state, the gate voltage of the power amplification transistor is controlled to clamp to the output voltage of the constant voltage source, so as to realize a function of overvoltage protection of the circuit.

5. The overvoltage protection and gain bootstrap circuit of claim 1, wherein
   when the diode is in a forward turn-on state, a DC voltage component of a gate voltage of the power amplification transistor is higher than the bias voltage provided by the bias circuit, so as to realize a function of gain bootstrap of the circuit.

6. The overvoltage protection and gain bootstrap circuit of claim 1, wherein
   the gate of the power amplification transistor is connected with an input end of a radio frequency signal, a drain of the power amplification transistor is connected with an output end of the radio frequency signal, and a source of the power amplification transistor is grounded, so as to realize power amplification of the radio frequency signal.

7. An overvoltage protection and gain bootstrap circuit of a power amplifier, comprising:
   a power amplification transistor and a diode, and the diode is reversely connected with a gate of the power amplification transistor;
   wherein
   a negative electrode of the diode is connected with the gate of the power transistor;
   a positive electrode of the diode is connected with a constant voltage source, such that a function of overvoltage protection and gain bootstrap of the circuit is realized by controlling a turn-on state of the diode;
   the gate of the power amplification transistor is connected with an input end of a radio frequency signal, a drain of the power amplification transistor is connected with an output end of the radio frequency signal, and a source of the power amplification transistor is grounded, so as to realize power amplification of the radio frequency signal;

the overvoltage protection and gain bootstrap circuit further comprising a first capacitor and a second capacitor; wherein the first capacitor is provided between the gate of the power amplification transistor and the input end of the radio frequency signal, and the second capacitor is provided between the drain of the power amplification transistor and the output end of the radio frequency signal.

8. An overvoltage protection and gain bootstrap circuit of a power amplifier, comprising:

a power amplification transistor and a diode, and the diode is reversely connected with a gate of the power amplification transistor;

wherein a negative electrode of the diode is connected with the gate of the power transistor;

a positive electrode of the diode is connected with a constant voltage source, such that a function of overvoltage protection and gain bootstrap of the circuit is realized by controlling a turn-on state of the diode;

the gate of the power amplification transistor is connected with an input end of a radio frequency signal, a drain of the power amplification transistor is connected with an output end of the radio frequency signal, and a source of the power amplification transistor is grounded, so as to realize power amplification of the radio frequency signal;

the overvoltage protection and gain bootstrap circuit further comprising a radio frequency choke, and the radio frequency choke is connected with the drain of the power amplification transistor.

9. The overvoltage protection and gain bootstrap circuit of claim 8, wherein the power amplifier comprises a metal oxide semiconductor field effect transistor.

10. A power amplifier, comprising the overvoltage protection and gain bootstrap circuit of claim 1.

11. An electronic apparatus comprising the power amplifier of claim 10, wherein the diode is configured to provide gate-drain overvoltage protection for the power amplification transistor, and to improve a gain of the power amplifier before power compression, thereby improving linearity of the power amplifier while reducing circuit complexity and occupied area.

12. The electronic apparatus of claim 11, wherein the power amplification transistor adopts a common-source structure.

13. The electronic apparatus of claim 11, wherein when a voltage difference between an output voltage of the constant voltage source and a gate voltage of the power amplification transistor is greater than a turn-on voltage of the diode, the diode is determined to be in a forward turn-on state.

14. The electronic apparatus of claim 13, wherein when the diode is in the forward turn-on state, the gate voltage of the power amplification transistor is controlled to clamp to the output voltage of the constant voltage source, so as to realize a function of overvoltage protection of the circuit.

15. The electronic apparatus of claim 11, wherein the gate of the power amplification transistor is further connected with a bias circuit, and the bias circuit is configured to provide a bias voltage for the power amplification transistor.

16. The electronic apparatus of claim 15, wherein when the diode is in a forward turn-on state, a DC voltage component of a gate voltage of the power amplification transistor is higher than the bias voltage provided by the bias circuit, so as to realize a function of gain bootstrap of the circuit.

17. The electronic apparatus of claim 15, wherein when the diode is in a forward turn-on state, the gain, at a 1 dB power compression point, of the circuit increases.

18. The electronic apparatus of claim 11, wherein the gate of the power amplification transistor is connected with an input end of a radio frequency signal, a drain of the power amplification transistor is connected with an output end of the radio frequency signal, and a source of the power amplification transistor is grounded, so as to realize power amplification of the radio frequency signal;

the overvoltage protection and gain bootstrap circuit further comprises a radio frequency choke, and the radio frequency choke is connected with the drain of the power amplification transistor; and the power amplifier comprises a metal oxide semiconductor field effect transistor.

* * * * *